(12) United States Patent
Chang et al.

(10) Patent No.: US 8,030,145 B2
(45) Date of Patent: Oct. 4, 2011

(54) BACK-GATED FULLY DEPLETED SOI TRANSISTOR

(75) Inventors: Leland Chang, Yorktown Heights, NY (US); Brian L. Ji, Yorktown Heights, NY (US); Arvind Kumar, Hopewell Junction, NY (US); Amlan Majumdar, Yorktown Heights, NY (US); Katherine Saenger, Yorktown Heights, NY (US); Leathen Shi, Yorktown Heights, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 80 days.

(21) Appl. No.: 12/684,225

(22) Filed: Jan. 8, 2010

(65) Prior Publication Data

US 2011/0171792 A1 Jul. 14, 2011

(51) Int. Cl.
*H01L 21/84* (2006.01)
(52) U.S. Cl. ............... 438/157; 438/458; 257/E21.421
(58) Field of Classification Search ............ 438/157, 438/458; 257/E21.421
See application file for complete search history.

(56) References Cited

U.S. PATENT DOCUMENTS

| 5,289,027 | A | 2/1994 | Terrill et al. |
|---|---|---|---|
| 5,619,054 | A | 4/1997 | Hashimoto |
| 5,942,781 | A | 8/1999 | Burr et al. |
| 6,072,217 | A | 6/2000 | Burr |
| 6,080,610 | A | 6/2000 | Hashimoto |
| 6,100,567 | A | 8/2000 | Burr |
| 6,307,233 | B1 | 10/2001 | Awaka et al. |
| 6,335,214 | B1 | 1/2002 | Fung |
| 6,383,904 | B1 | 5/2002 | Yu |
| 6,391,695 | B1 | 5/2002 | Yu |
| 6,423,599 | B1 | 7/2002 | Yu |
| 6,611,023 | B1 | 8/2003 | En et al. |
| 2010/0176482 | A1* | 7/2010 | Dennard et al. ............ 257/506 |
| 2011/0114918 | A1* | 5/2011 | Lin et al. ............ 257/24 |

FOREIGN PATENT DOCUMENTS

JP   05267663 A   10/1993

OTHER PUBLICATIONS

Young, K. K., "Short-Channel Effect in Fully-Depleted SOI MOSFETs" IEEE Trans. Electron Devices (1989) pp. 399-402, vol. 36.

(Continued)

*Primary Examiner* — Trung Q Dang
(74) *Attorney, Agent, or Firm* — Scully, Scott, Murphy & Presser, P.C.; Louis J. Percello, Esq.

(57) ABSTRACT

A fully depleted semiconductor-on-insulator (FDSOI) transistor structure includes a back gate electrode having a limited thickness and aligned to a front gate electrode. The back gate electrode is formed in a first substrate by ion implantation of dopants through a first oxide cap layer. Global alignment markers are formed in the first substrate to enable alignment of the front gate electrode to the back gate electrode. The global alignment markers enable preparation of a virtually flat substrate on the first substrate so that the first substrate can be bonded to a second substrate in a reliable manner.

21 Claims, 9 Drawing Sheets

OTHER PUBLICATIONS

Trivedi, V. P. et al., "Scaling Fully Depleted SOI CMOS" IEEE Trans. Electron Devices (2003) pp. 2095-2103, vol. 50.

Kumar, A. et al., "Quantum-Based Simulation Analysis of Scaling in Ultrathin Body Device Structures" IEEE Trans. Electron Devices (2005) pp. 614-617, vol. 52.

Singh, D. V. et al., "Stress Memorization in High-Performance FDSOI Devices with Ultra-Thin Silicon Channels and 25 nm Gate Lengths" IEDM Tech. Dig. (2005) pp. 511-514.

Trivedi, V. P. et al., "Nanoscale FDSOI CMOS: Thick or Thin BOX?" IEEE Trans. Electron Device Letter (2005) pp. 26-28, vol. 26.

* cited by examiner

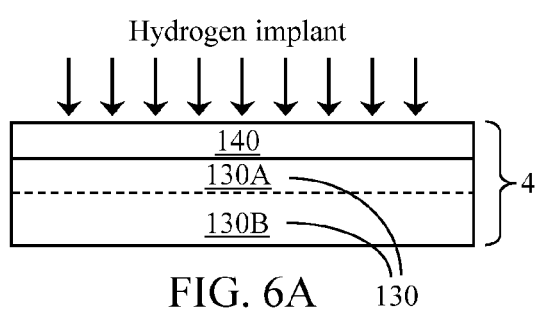
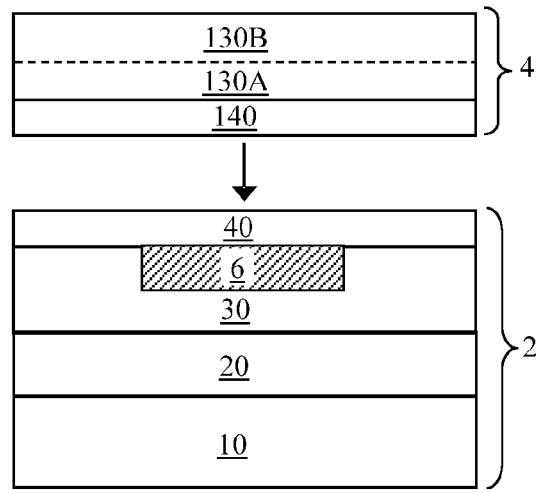
FIG. 6A    FIG. 6B
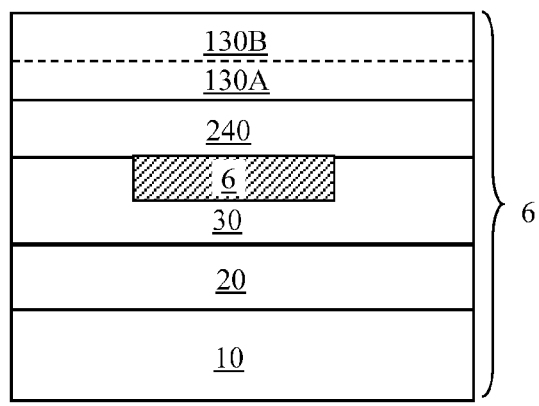
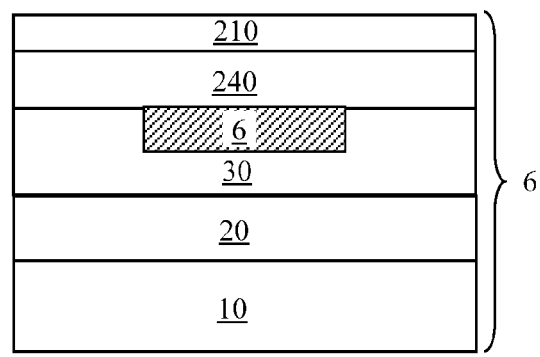
FIG. 6C    FIG. 6D

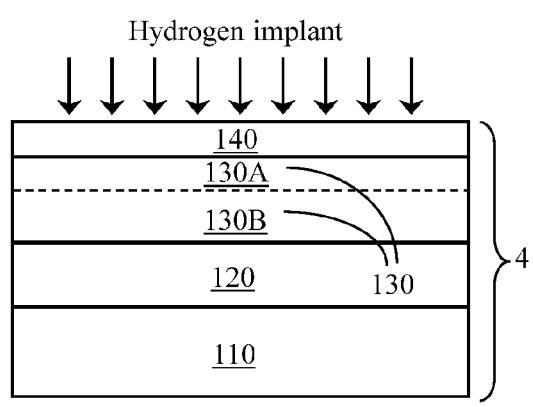
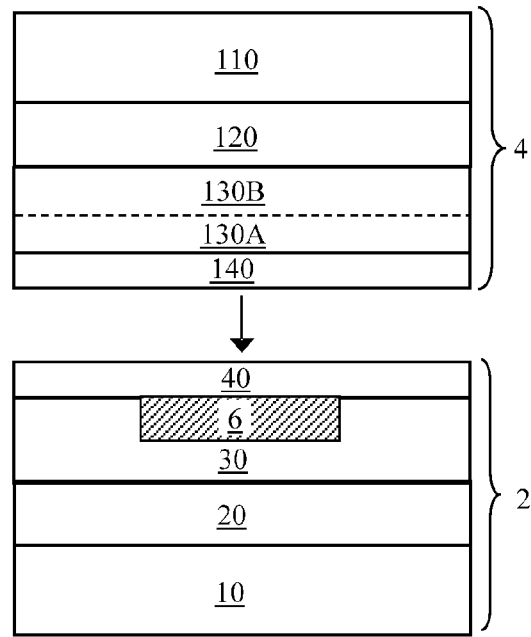
FIG. 7A
FIG. 7B
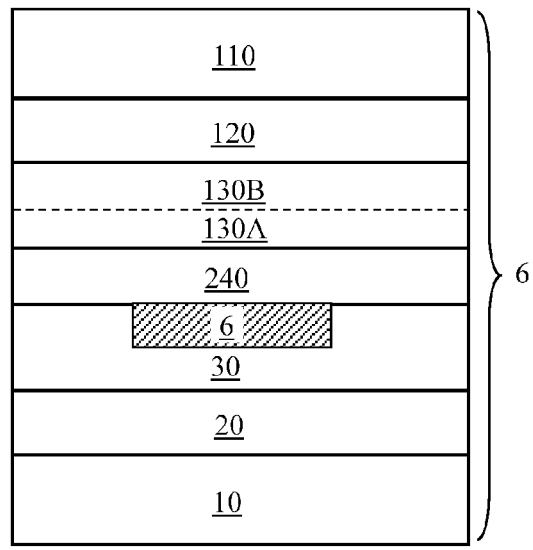
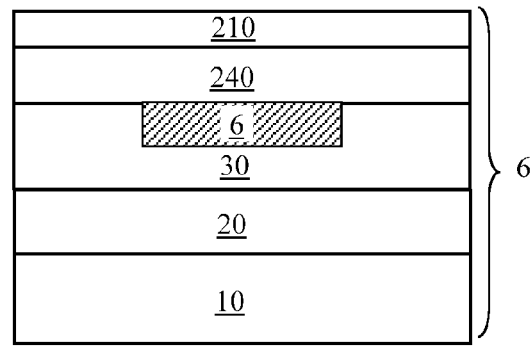
FIG. 7C
FIG. 7D

BACK-GATED FULLY DEPLETED SOI TRANSISTOR

BACKGROUND

The present invention relates to field-effect transistors (FETs), and more particularly to thin-body fully-depleted semiconductor-on-insulator (SOI) FETs including a back gate self-aligned to a front gate, and methods of manufacturing the same.

Complementary metal-oxide semiconductor (CMOS) field-effect transistors (FETs) are employed in almost every electronic circuit application, such as signal processing, computing, and wireless communications. Scaling down the gate length of both N-channel FETs (NFETs) and P-channel FETs (PFETs) in CMOS circuits to shorter dimensions can increase the speed of the CMOS circuits. However, detrimental short-channel effects can lead to high off-state leakage currents in CMOS devices, thereby increasing the power consumption. In case of extreme short-channel effects, CMOS circuits fail to operate.

Fully-depleted semiconductor-on-insulator (FDSOI) FETs with thin SOI bodies provide improved electrostatic integrity than thick-body partially-depleted SOI (PDSOI) FETs. For example, K. K. Young, "Short-channel effect in fully-depleted SOI MOSFETs", IEEE Trans. Electron Devices, vol. 36, pp. 399-402 (1989); V. P. Trivedi and J. G. Fossum, "Scaling fully depleted SOI CMOS", IEEE Trans. Electron Devices, vol. 50, pp. 2095-2103 (2003); A. Kumar, J. Kedzierski, and S. E. Laux, "Quantum-based simulation analysis of scaling in ultrathin body device structures", IEEE Trans. Electron Devices, vol. 52, pp. 614-617 (2005); and D. V. Singh et al., "Stress memorization in high-performance FDSOI devices with ultra-thin silicon channels and 25 nm gate lengths", in IEDM Tech. Dig., 2005, pp. 511-514 provide theoretical predictions and experimental demonstration of superior short-channel characteristics of thin semiconductor-on-insulator (SOI) FETs.

As described in V. P. Trivedi and J. G. Fossum, "Nanoscale FDSOI CMOS: thick or thin BOX ?", IEEE Electron Device Lett., vol. 26-28, pp. 26,2005, the application of a back gate voltage with the buried oxide (BOX) acting as the back gate dielectric leads to further improvement in short-channel effects of thin SOI FETs. Further, it is well known that a back gate voltage can also be used for tuning the FET threshold voltage.

Several back-gated SOI structures have been proposed in the past, though primarily for threshold voltage control, where the back gate electrode is beneath the entire active area, such as, in U.S. Pat. No. 5,289,027 to Terrill et al., U.S. Pat. No. 5,619,054 to Hashimoto, U.S. Pat. No. 6,080,610 to Hashimoto, and U.S. Pat. No. 6,307,233 Awaka et al. The overlap of the back gate electrode with the source/drain region leads to increased parasitic capacitance, which leads to slower FET switching speed. Therefore, in order to minimize the parasitic capacitance penalty, localized back gates are desired.

A known method for creating localized and self-aligned back gates is a replacement gate process, where the back gates are implanted after the removal of the dummy gate. This method is disclosed, for example, in U. S. Pat. No. 5,942,781 to Burr et al., U.S. Pat. No. 6,072,217 to Burr, U.S. Pat. No. 6,100,567 to Burr, U.S. Pat. No. 6,383,904 to Yu, U.S. Pat. No. 6,391,695 to Yu, U.S. Pat. No. 6,423,599 to Yu, and U.S. Pat. No. 6,611,023 to En et al. Creating a back gate in a replacement gate flow involves back gate ion implantation through the SOI channel and the BOX layers, which necessitates the use of high energy ion implantation. High energy implants through the thin SOI region may amorphize the channel region, which is detrimental for FET drive current. Furthermore, high energy back gate implants will have large vertical as well as lateral straggle (e.g., 300 nm for As implantation at 500 keV of energy). Large lateral straggle not only limits the proximity of adjacent NFETs and PFETs, but also leads to unintentional overlap of the back gate electrode with the source/drain region.

In general, reliable alignment of forming FDSOI devices in which a back gate is aligned to a front gate poses a challenge to semiconductor manufacturing. An economical and manufacturing-friendly method of reliably aligning a back gate to a front gate on FDSOI devices while minimizing an overlay offset is desirable.

BRIEF SUMMARY

According to an embodiment of the present invention, a fully depleted semiconductor-on-insulator (FDSOI) transistor structure includes a back gate electrode having a limited thickness and aligned to a front gate electrode. The back gate electrode is formed in a first substrate by ion implantation of dopants through a first oxide cap layer, which functions as a screening oxide layer to limit the depth of ion implantation and to prevent channeling of ions. A very well-defined back gate electrode is formed by using low-energy ion implantation to limit the thickness of the back gate electrode. Global alignment markers are formed in the first substrate to enable alignment of the front gate electrode to the back gate electrode. The global alignment markers enable preparation of a virtually flat substrate on the first substrate so that the first substrate can be bonded to a second substrate in a reliable manner.

According to an aspect of the present invention, a method of forming a semiconductor structure includes forming a doped semiconductor region in an upper portion of a first semiconductor layer of a first substrate by implanting dopant ions through a portion of a first oxide cap layer on the first semiconductor layer; forming a layer of hydrogen atoms in a second semiconductor layer of a second substrate by implanting hydrogen ions through an entirety of a second oxide cap layer on the second semiconductor layer; forming a bonded substrate by bonding the first substrate and the second substrate at an interface of the first oxide cap layer and the second oxide cap layer; and forming a dual gate field effect transistor on the bonded substrate. The first and second oxide cap layers form a buried oxide layer, and a portion of the second semiconductor layer on one side of the layer of hydrogen atoms constitute a semiconductor-on-insulator (SOI) layer. The doped semiconductor region constitutes a back gate electrode and a front gate electrode overlies an entirety of the back gate electrode.

BRIEF DESCRIPTION OF THE SEVERAL VIEWS OF THE DRAWINGS

FIGS. 6A-6D are sequential vertical cross-sectional views of a third exemplary semiconductor structure according to a third embodiment of the present invention.

FIGS. 7A-7D are sequential vertical cross-sectional views of a fourth exemplary semiconductor structure according to a fourth embodiment of the present invention.

FIG. 8A is a top-down view. FIG. 8B is a vertical cross-sectional view along the plane X-X'. FIG. 8C is a vertical cross-sectional view along the plane Y-Y'.

FIG. 9A is a vertical cross-sectional view along a plane corresponding to plane X-X' in FIG. 8A. FIG. 9B is a vertical cross-sectional view along a plane corresponding to plane Y-Y' in FIG. 8A.

DETAILED DESCRIPTION

Figure 1A:
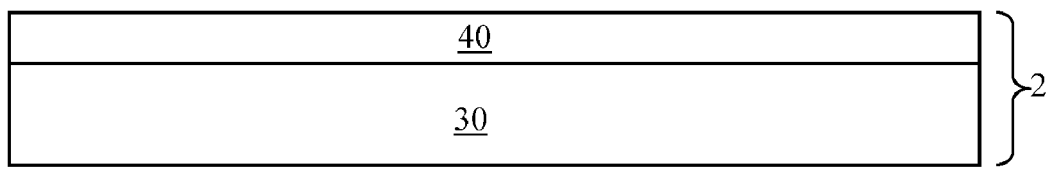
FIG. 1A is a vertical cross-sectional view of a first exemplary structure for a first substrate according to an embodiment of the present invention.

As stated above, the present invention relates to thin-body fully-depleted semiconductor-on-insulator (SOI) FETs including a back gate self-aligned to a front gate, and methods of manufacturing the same, which are now described with accompanying figures. Throughout the drawings, the same reference numerals or letters are used to designate like or equivalent elements. The drawings are not necessarily drawn to scale.

As used herein, an "overlap" between a first element and a second element refers to a common area between an area of the first element and an area of the second element in a top-down see-through view in a direction normal to a surface of a substrate.

Referring to FIG. 1A, a first exemplary structure for a first substrate 2 includes a stack of a first semiconductor layer 30 and a first oxide cap layer 40. The first semiconductor layer 30 includes a semiconductor material, which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material comprises silicon. Preferably, the first semiconductor layer 30 is single crystalline. The first semiconductor layer 30 can constitute a bulk substrate. It is desirable for the first semiconductor layer 30 to be undoped or lightly doped with a carrier density less than $10^{16}/cm^3$. The thickness of the first semiconductor layer 30 can be from 200 microns to 1,000 microns, although lesser and greater thicknesses can also be employed.

The first oxide cap layer 40 includes an oxide material. The oxide material of the first oxide cap layer 40 can be an oxide of the semiconductor material of the first semiconductor layer 30 formed by thermal oxidation or plasma oxidation of a top surface of the first semiconductor layer 30. For example, if the first semiconductor layer 30 is a single crystalline silicon layer, the first oxide cap layer 40 can be a layer of thermal silicon oxide. Alternately, the oxide material of the first oxide cap layer 40 can be deposited by deposition such as chemical vapor deposition or a spin-on coating. Preferably, the thickness of the first oxide cap layer 40 is from 1 nm to 5 nm in order to minimize the thickness of a buried first oxide cap layer to be subsequently formed from the first oxide cap layer 40, although lesser and greater thicknesses can also be employed.

Figure 1B:
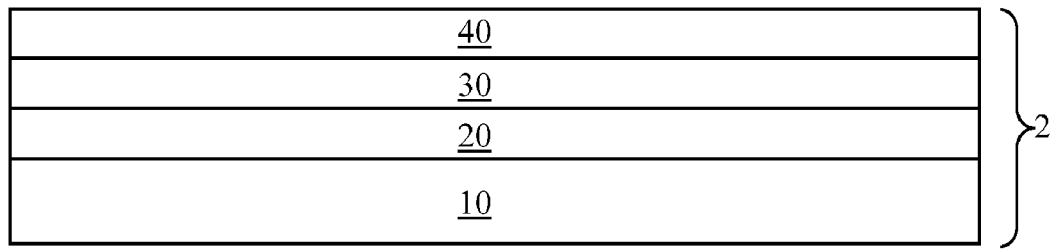
FIG. 1B is a vertical cross-sectional view of a second exemplary structure for a first substrate according to a second embodiment of the present invention.

Referring to FIG. 1B, a second exemplary structure for a first substrate 2 includes a vertical stack, from bottom to top, of a first handle substrate 10, a first buried insulator layer 20, a first semiconductor layer 30, and a first oxide cap layer 40. The first semiconductor layer 30 is a semiconductor-on-insulator (SOI) layer having a thickness from 3 nm to 100 nm, and preferably from 10 nm to 30 nm, although lesser and greater thicknesses can also be employed. If the starting thickness of the SOI layer is greater than a target thickness, then the SOI layer can be thinned to the target thickness employing a combination of oxidation and etch, for example, using hydrofluoric acid. The first oxide cap layer 40 can have the same thickness, and can be formed in the same manner, as in the first exemplary structure for the first substrate 2.

The first handle substrate 10 can comprise a semiconductor material, a conductor material, or an insulator material. In case the first handle substrate 10 comprises a semiconductor material, the first handle substrate 10 can comprise any of the semiconductor materials that can be employed for the first semiconductor layer 30. The thickness of the first handle substrate 10 can be from 200 micons to 1,000 microns, although lesser and greater thicknesses can also be employed.

The first buried insulator layer 20 comprises an insulator material, which can be, but is not limited to, silicon oxide, silicon nitride, or a combination thereof. The thickness of the first buried insulator layer 20 can be from 10 nm to 300 nm, and preferably from 30 nm to 100 nm, although lesser and greater thicknesses can also be employed.

Figure 2:
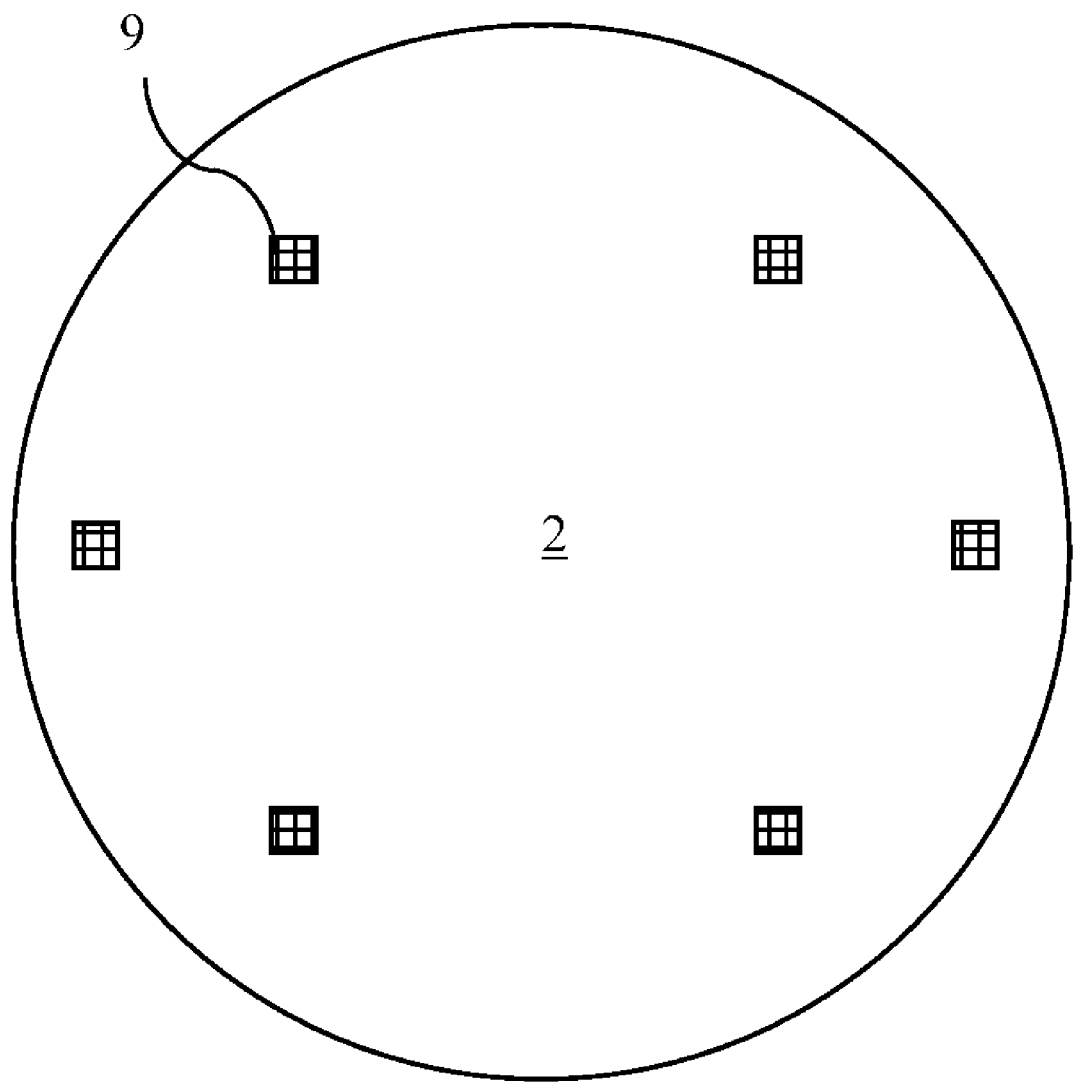
FIG. 2 is a top-down view of the first or second exemplary structure for the first substrate according to the first or second embodiment of the present invention.

FIG. 2 schematically represents alignment markers 9 formed on selected parts of the first substrate 2. The first substrate 2 can be the first exemplary structure or the second exemplary structure in this case. The alignment marks are formed by applying a photoresist (not shown), lithographically patterning the photoresist to pattern the shapes for the alignment marks, transferring the pattern in the photoresist into the first substrate 2 in a reactive ion etch (RIE), and removing the photoresist. The removal of the photoresist can be effected by dry resist strip such as oxygen plasma ashing, wet resist strip such as sulphuric acid, or a combination thereof. The alignment marks are formed at least in the first semiconductor layer 30. Preferably, each alignment marker extends from the top surface of the first substrate, i.e., from the top surface of the first oxide cap layer 40, into a portion of the first semiconductor layer 30. If a buried insulator layer 20 is present as in the second exemplary structure for the first substrate 2, the void in each alignment marker 9 preferably extend to the first handle substrate 10.

It is beneficial to create global alignment markers for the entire substrate at selected regions to minimize the amount of voids that are present in the alignment markers. Since stateof-the-art photolithography tools perform substrate-level global alignment, the presence of 4 to 6 alignment markers is sufficient to obtain very tight overlay tolerance with less than 10 nm overlay error. The global alignment marks are laterally separated by a distance greater than a size of an exposure field of a lithography tool.

Figure 3A:
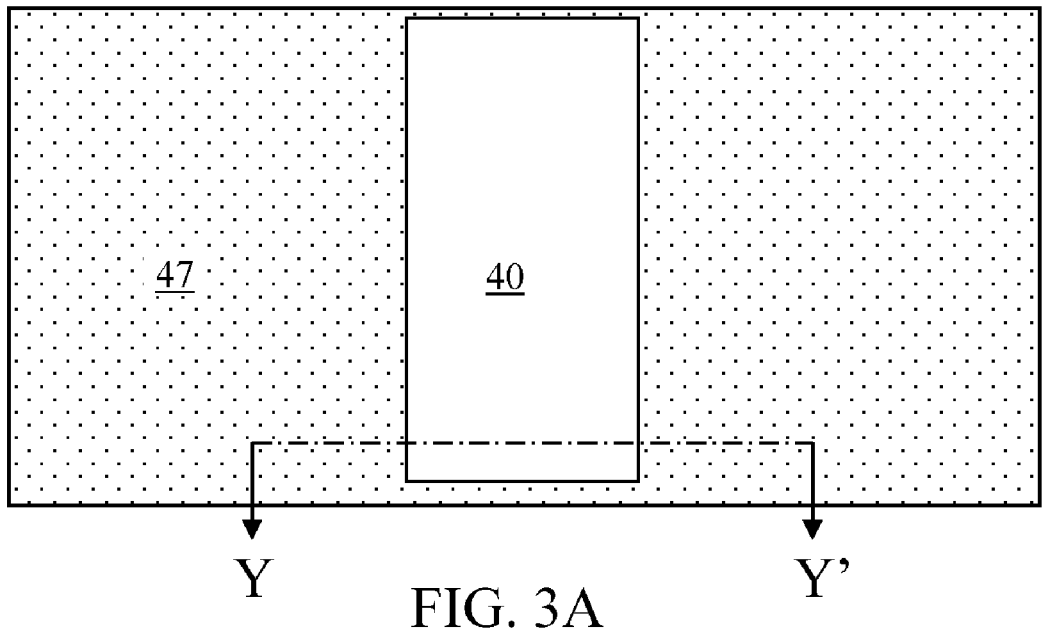
FIG. 3A is a top-down view of the first or second exemplary structure for the first substrate during an ion implantation step.
Figure 3B:
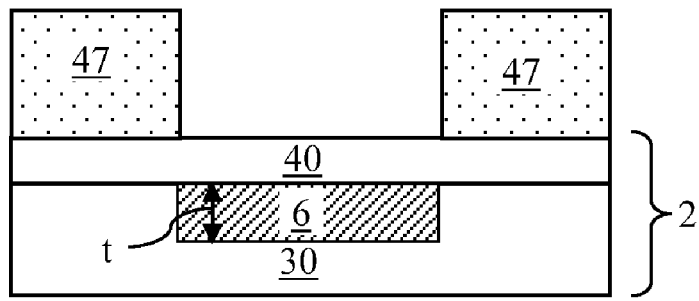
FIG. 3B is a vertical cross-sectional view of the first exemplary structure for the first substrate during ion implantation along the plane Y-Y' in FIG. 3A.
Figure 3C:
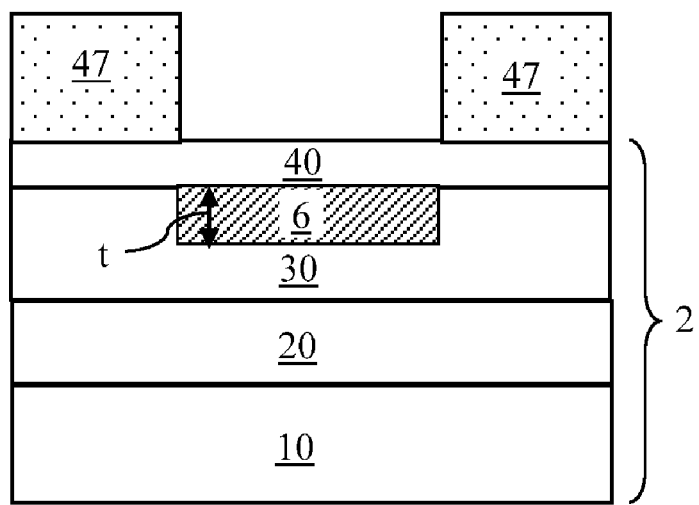
FIG. 3C is a vertical cross-sectional view of the second exemplary structure for the first substrate during ion implantation along the plane Y-Y' in FIG. 3A.

Back gate electrodes 6 for n-type field effect transistors (NFETs) and p-type field effect transistors (PFETs) are formed by the repeated use of photolithography, ion implantation, and photoresist stripping. Referring to FIGS. 3A-3C, formation of a back gate electrode 6 is schematically illustrated. FIG. 3A is a top-down view of the first or second exemplary structure including the first substrate 2 at this step. FIG. 3B is a vertical cross-sectional view of the first exemplary structure along the plane Y-Y' in FIG. 3A at this step. FIG. 3C is a vertical cross-sectional view of the second exemplary structure along the plane Y-Y' in FIG. 3A at this step.

The back gate electrodes 6 can be formed by applying a photoresist 47 over the first substrate 2. The photoresist 47 is lithographically patterned to form openings therein. Dopant ions are implanted through each opening into an upper portion of the first semiconductor layer 30 to form the back gate electrodes 6. Each back gate electrode 6 is a doped semiconductor region. Preferably, the back gate electrode 6 has a doping of the opposite conductivity type than the first semiconductor layer 30 so that a p-n junction is formed at an interface between the back gate electrode 6 and the first semiconductor layer 30. While FIGS. 3A-3C illustrates formation of a single back gate electrode 6, a plurality of back gate electrodes 6 can be formed by replicating the structures of FIGS. 3A-3C on the first substrate 2. The photoresist 47 is subsequently removed. The application and patterning of a photoresist, ion implantation, and removal of the photoresist can be repeated as needed to form a first group of back gate electrodes 6 that are doped with p-type dopants and a second group of back gate electrodes 6 that are doped with n-type dopants.

Because the photoresist 47 blocks the ions from entering the first semiconductor layer 30, the area of the back gate electrodes 6 substantially coincides with the area of the openings in the photoresist 47. During the ion implantation steps, the first oxide cap layer 40, which is preferably from 1 nm to 5 nm in thickness, functions as a screening oxide layer to reduce implant damage to the first semiconductor layer 30 and to avoid ion channeling. By avoiding ion channeling, the thickness t of the back gate electrodes 6 can be limited to a minimal dimension. For example, the thickness t of the back gate electrode 6 can be from 5 nm to 50 nm, and preferably from 5 nm to 20 nm, although lesser and greater thicknesses are also contemplated herein.

Further, since the back gate electrodes 6 are formed just beneath the first oxide cap layer 40, the energy of the ions during the ion implantation step can be low, e.g., in a range from 1 keV to 20 keV. This leads to very well defined back gate electrodes 6 with minimal vertical and lateral straggles. Low lateral straggle is a desirable property for ion implantation steps employed in forming back gate electrodes 6 because physical overlap with source/drain regions to be subsequently formed is reduced. Such reduction in physical overlap decreases the overlap capacitance between the back gate electrodes 6 and the source/drain regions of field effect transistors.

The conductivity type and the optimal dopant concentration for each back gate electrode 6 can be selected in consideration of the threshold voltage requirement for each field effect transistor. Further, other structural parameters can affect the optimal dopant concentration for each back gate electrode 6. Such structural parameters include, but are not limited to, the thickness of a back gate dielectric layer to be subsequently formed, the thickness of a front gate dielectric layer to be subsequently formed, and the work function of a front gate electrode to be subsequently formed. Thus, a back gate electrode 6 can have either n-type dopants, such as, As, P, or Sb, or p-type dopants, such as, B, $BF_2$, or In. The implantation dose can be from $10^{13}/cm^2$ to $10^{16}/cm^2$, although lesser and greater ion implantation doses can also be employed.

After the back gate ion implantation steps and the removal of the last photoresist employed for ion implantation steps, the first substrate 2 can be annealed to cure the implantation damage, i.e., the crystalline defects that are caused by the ion implantation. The anneal temperature can be in the range from 500° C. to 1000° C., and the anneal time can be in the range from 1 sec up to 10 min. Typically, a lower anneal time is selected for a higher anneal temperature to avoid lateral diffusion of the dopant atoms in the back gate electrodes 6 during the anneal.

Subsequently, the first substrate 2 is bonded to a second substrate. The second substrate can be a bulk substrate or an SOI substrate. The second substrate includes a second oxide cap layer that is bonded to the first oxide cap layer 2 of the first substrate 2. This leads to the four exemplary semiconductor structures described below.

FIGS. 4A-4D illustrate the processing steps that can be employed to form a first exemplary semiconductor structure according to a first embodiment of the present invention. The first embodiment employs a second substrate 4, which includes a second semiconductor layer 130 and a second oxide cap layer 140. The second semiconductor layer 130 constitutes a bulk semiconductor substrate.

Figure 4A:
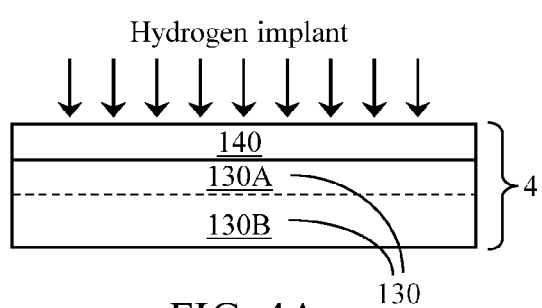
FIGS. 4A-4D are sequential vertical cross-sectional views of a first exemplary semiconductor structure according to a first embodiment of the present invention.

Referring to FIG. 4A, the second semiconductor layer 130 includes a semiconductor material, which can be any material that can be employed for the first semiconductor layer 30. Typically, the semiconductor material of the second semiconductor layer 130 comprises silicon. Preferably, the second semiconductor layer 130 is single crystalline. It is desirable for the second semiconductor layer 130 to be undoped or lightly doped with a carrier density less than $10^{16}/cm^3$. The thickness of the second semiconductor layer 130 can be from 200 microns to 1,000 microns, although lesser and greater thicknesses can also be employed.

The second oxide cap layer 140 includes an oxide material. The oxide material of the second oxide cap layer 140 can be an oxide of the semiconductor material of the second semiconductor layer 130. The oxide of the semiconductor material can be formed by thermal oxidation or plasma oxidation of a top surface of the second semiconductor layer 130. For example, if the second semiconductor layer 130 is a single crystalline silicon layer, the second oxide cap layer 140 can be a layer of thermal silicon oxide. Alternately, the oxide material of the second oxide cap layer 140 can be deposited by deposition such as chemical vapor deposition or a spin-on coating. The thickness of the second oxide cap layer 140 is selected so that the sum of the thickness of the first oxide cap layer 40 and the thickness of the second oxide cap layer 140 equals the target thickness of a buried insulator layer in a bonded substrate. The thickness of the second oxide cap layer 140 can be from 1 nm to 45 nm, and preferably from 1 nm to 15 nm, although lesser and greater thicknesses can also be employed.

Hydrogen ions, i.e., protons, are implanted through the second oxide cap layer 140 into the second semiconductor layer 130 to form an embedded layer of hydrogen atoms therein. The implantation of hydrogen atoms is a blanket ion implantation, i.e., an ion implantation that does not employ any patterned masking layer. The embedded layer of hydrogen atoms is represented as a dotted line, which separates a surface semiconductor portion 130A from a bulk semiconductor portion 130B. Methods known in the art as "smart cut" can be employed to form the embedded layer of hydrogen atoms.

Preferably, the thickness of the surface semiconductor portion 130A is selected to match the target thickness of an SOI layer in a bonded substrate. For example, the thickness of the surface semiconductor portion 130A can be from 10 nm to 100 nm. After the hydrogen ion implantation, the second substrate 4 includes the bulk semiconductor portion 130B, the layer of hydrogen atoms, the surface semiconductor portion 130A, and the second oxide cap layer 140. The SOI layer includes a semiconductor material, which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

Figure 4B:
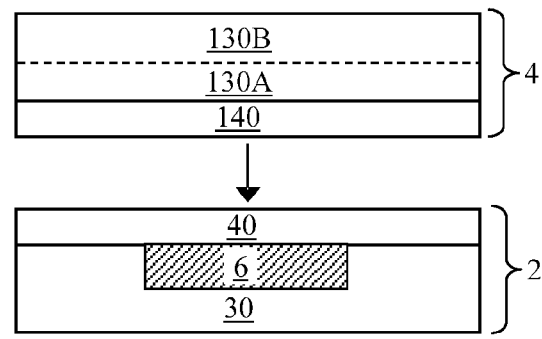

Referring to FIG. 4B, the second substrate 4 is flipped upside down over a first exemplary structure for a first substrate 2. The second substrate 4 and the first substrate 2 are brought to physical contact with each other. The top surface of the first oxide cap layer 40 contacts the top surface (which is now located at the bottom of the second substrate 4) of the second oxide cap layer 140.

Figure 4C:
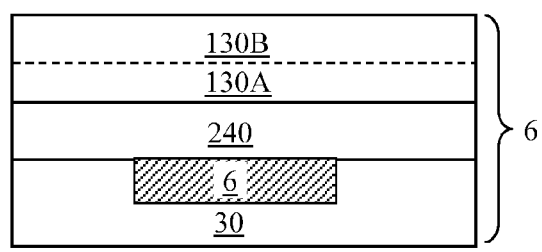

Referring to FIG. 4C, the first oxide cap layer 40 and the second oxide cap layer 140 are bonded by methods known in the art, i.e., by an anneal, to form a buried oxide layer 240. The bonding anneal is typically performed in a temperature range from 500° C. to 700° C. to avoid diffusion of the back gate implants. The first substrate 2 and the second substrate 4 collectively form a bonded substrate 6 upon bonding. The thickness of the buried oxide layer 240 can be from 2 nm to 50 nm, and preferably from 2 nm to 20 nm, although lesser and greater thicknesses can also be employed.

Figure 4D:
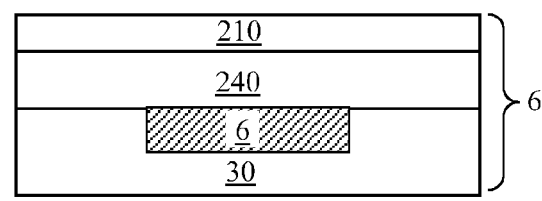

Referring to FIG. 4D, the bulk semiconductor portion 130E is cleaved off from the surface semiconductor portion 130A at the layer of hydrogen atoms. A smart cut process can be employed to remove the bulk semiconductor portion 13013 without inducing structural defects to the surface semiconductor portion 130A. The surface semiconductor portion 130A that remains on the buried oxide layer 240 is herein referred to an SOI layer 210. The bonded substrate 6 includes a first semiconductor layer 30, a back gate electrode 6 embedded in the first semiconductor layer 30, the buried insulator layer 240, and the SOI layer 210. The bonded substrate 6 in the first exemplary semiconductor structure is a handle substrate that provides sufficient structural strength for mechanically handling the bonded substrate 6.

The thickness of the SOI layer 210 can be from 10 nm to 100 nm. Optionally, if the thickness of the SOI layer 210 as formed in the bonded substrate 6 is greater than a target thickness, the SOI layer 210 can be thinned, for example, by oxidation of a surface portion of the SOI layer and removal of an oxidized portion of the SOI layer. An oxidation at this stage can be effected by, for example, low-temperature plasma-enhanced oxidation such that the back gate implants do not diffuse during oxidation.

FIGS. 5A-5D illustrate the processing steps that can be employed to form a second exemplary semiconductor structure according to a second embodiment of the present invention. The second embodiment employs a second substrate 4, which includes a second handle substrate 110, a second buried insulator layer 120, a second semiconductor layer 130, and a second oxide cap layer 140. The second handle substrate 110, the second buried insulator layer 120, and the second semiconductor layer 130 constitute an SOI substrate.

Figure 5A:
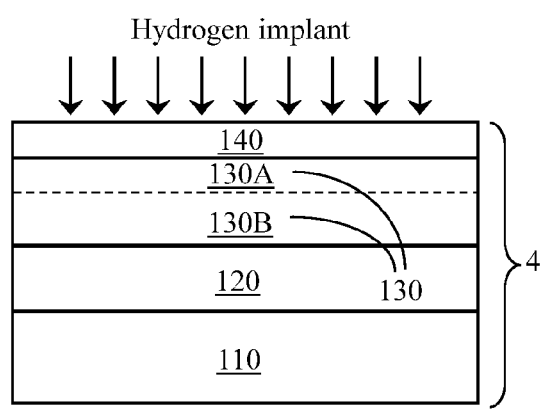
FIGS. 5A-5D are sequential vertical cross-sectional views of a second exemplary semiconductor structure according to a second embodiment of the present invention.

Referring to FIG. 5A, the second handle substrate 110 can have the same composition and the same thickness as the first handle substrate 10. The second buried insulator layer 120 can have the same composition and the same thickness as the first buried insulator layer 20. The second semiconductor layer 130 can have the same composition as the first semiconductor layer 30. Typically, the semiconductor material of the second semiconductor layer 130 comprises silicon. Preferably, the second semiconductor layer 130 is single crystalline. The thickness of the second semiconductor layer 130 can be from 20 nm to 300 nm, although lesser and greater thicknesses can also be employed. The composition and the thickness of the second oxide cap layer 140 can be the same as in the first embodiment.

Hydrogen ions are implanted through the second oxide cap layer 140 into the second semiconductor layer 130 to form an embedded layer of hydrogen atoms therein in the same manner as in the first embodiment. After the hydrogen ion implantation, the second substrate 4 includes a second handle substrate 110, a second buried insulator layer 120, a bulk semiconductor portion 130B, a layer of hydrogen atoms, a surface semiconductor portion 130A, and the second oxide cap layer 140.

Figure 5B:
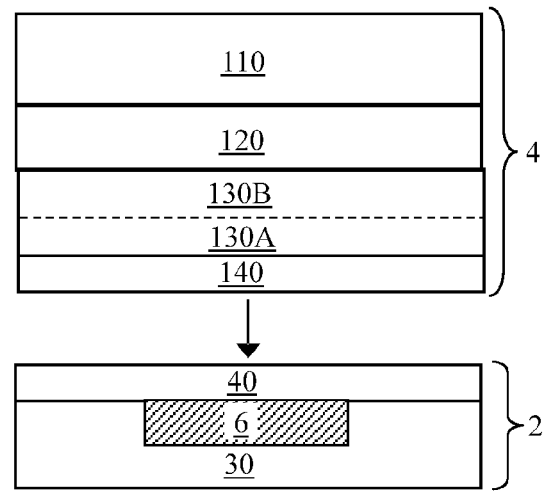

Referring to FIG. 5B, the second substrate 4 is flipped upside down over a first exemplary structure for the first substrate 2. The second substrate 4 and the first substrate 2 are brought to physical contact with each other. The top surface of the first oxide cap layer 40 contacts the top surface (which is now located at the bottom of the second substrate 4) of the second oxide cap layer 140.

Figure 5C:
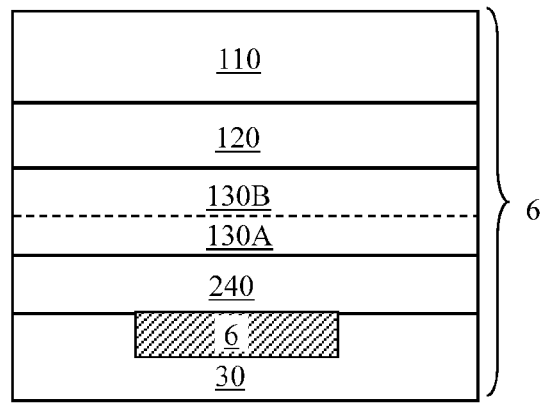

Referring to FIG. 5C, the first oxide cap layer 40 and the second oxide cap layer 140 are bonded by methods known in the art to form a buried oxide layer 240. The first substrate 2 and the second substrate 4 collectively form a bonded substrate 6 upon bonding. The thickness of the buried oxide layer 240 can be from 2 nm to 50 nm, and preferably from 2 nm to 20 nm, although lesser and greater thicknesses can also be employed.

Figure 5D:
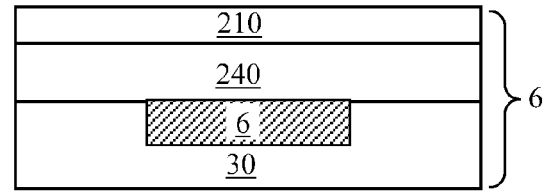

Referring to FIG. 5D, the assembly of the second handle substrate 110, the second buried insulator layer 120, and the bulk semiconductor portion 130B is cleaved off from the surface semiconductor portion 130A at the layer of hydrogen atoms in the same manner as in the first embodiment. The surface semiconductor portion 130A that remains on the buried oxide layer 240 is herein referred to an SOI layer 210. The bonded substrate 6 includes a first semiconductor layer 30, a back gate electrode 6 embedded in the first semiconductor layer 30, the buried insulator layer 240, and the SOI layer 210. Thus, the bonded substrate 6 according to the second embodiment can have an identical structure as the bonded structure 6 according to the first embodiment.

FIGS. 6A-6D illustrate the processing steps that can be employed to form a third exemplary semiconductor structure according to a third embodiment of the present invention. The third embodiment employs a second substrate 4 that is identical to the second substrate 4 in the first embodiment. The second semiconductor layer 130 constitutes a bulk semiconductor substrate.

Referring to FIG. 6A, the same processing step is performed as in the first embodiment to form a surface semiconductor portion 130A and a bulk semiconductor portion 130B.

Referring to FIG. 6B, the second substrate 4 is flipped upside down over a second exemplary structure for the first substrate 2. The second exemplary structure for the first substrate 2 includes, from bottom to top, a first handle substrate 10, a first buried insulator layer 20, a first semiconductor layer 30, a back gate electrode 6 that is embedded therein, and a first oxide cap layer 40. The second substrate 4 and the first substrate 2 are brought to physical contact with each other. The top surface of the first oxide cap layer 40 contacts the top surface (which is now located at the bottom of the second substrate 4) of the second oxide cap layer 140.

Referring to FIG. 6C, the first oxide cap layer 40 and the second oxide cap layer 140 are bonded by methods known in the art to form a buried oxide layer 240. The first substrate 2 and the second substrate 4 collectively form a bonded substrate 6 upon bonding. The thickness of the buried oxide layer 240 can be from 2 nm to 50 nm, and preferably from 2 nm to 20 nm, although lesser and greater thicknesses can also be employed.

Referring to FIG. 6D, the bulk semiconductor portion 130B is cleaved off from the surface semiconductor portion 130A at the layer of hydrogen atoms in the same manner as in the first embodiment. The surface semiconductor portion 130A that remains on the buried oxide layer 240 is herein referred to an SOI layer 210. The bonded substrate 6 includes a first handle substrate 10, a first buried insulator layer 20, a first semiconductor layer 30, a back gate electrode 6 embedded in the first semiconductor layer 30, the buried insulator layer 240, and the SOI layer 210.

[0058] FIGS. 7A-7D illustrate the processing steps that can be employed to form a fourth exemplary semiconductor structure according to a fourth embodiment of the present invention. The fourth embodiment employs a second substrate 4 that is identical to the second substrate 4 in the second embodiment. A second handle substrate 110, a second buried insulator layer 120, and a second semiconductor layer 130 collectively constitute an SOI substrate.

Referring to FIG. 7A, the same processing step is performed as in the second embodiment to form a surface semiconductor portion 130A and a bulk semiconductor portion 130B.

Referring to FIG. 7B, the second substrate 4 is flipped upside down over a second exemplary structure for the first substrate 2. The second exemplary structure is the same as in the third embodiment. The second substrate 4 and the first substrate 2 are brought to physical contact with each other. The top surface of the first oxide cap layer 40 contacts the top surface (which is now located at the bottom of the second substrate 4) of the second oxide cap layer 140.

Referring to FIG. 7C, the first oxide cap layer 40 and the second oxide cap layer 140 are bonded by methods known in the art to form a buried oxide layer 240. The first substrate 2 and the second substrate 4 collectively form a bonded substrate 6 upon bonding. The thickness of the buried oxide layer 240 can be from 2 nm to 50 nm, and preferably from 2 nm to 20 nm, although lesser and greater thicknesses can also be employed.

Referring to FIG. 7D, the assembly of the second handle substrate 110, the second buried insulator layer 120, and the bulk semiconductor portion 130B is cleaved off from the surface semiconductor portion 130A at the layer of hydrogen atoms in the same manner as in the second embodiment. The surface semiconductor portion 130A that remains on the buried oxide layer 240 is herein referred to an SOI layer 210. The bonded substrate 6 includes a first handle substrate 10, a first buried insulator layer 20, a first semiconductor layer 30, a back gate electrode 6 embedded in the first semiconductor layer 30, the buried insulator layer 240, and the SOI layer 210. Thus, the bonded substrate 6 according to the fourth embodiment can have an identical structure as the bonded structure 6 according to the third embodiment.

In each embodiment, dopant ions are implanted through the first oxide cap layer 40 to form the back gate electrodes 6 embedded in a first semiconductor layer 30 employing a patterned ion implantation mask layer, e.g., a photoresist 47 (See FIGS. 3A-3C). The dopant ions pass through only portions of the first oxide cap layer 40 underneath which back gate electrodes 6 are formed. Hydrogen atoms are implanted through the second oxide cap layer 140 to form an embedded layer of hydrogen atoms in a second semiconductor layer 130 by a blanket ion implantation without employing any ion implantation mask, The first oxide cap layer 40 and the second oxide cap layer 140 are subsequently bonded to form the buried insulator layer 240, whereby a surface semiconductor portion 130A of the second semiconductor layer 130 becomes an SOI layer after bonding in a bonded substrate 6. The buried insulator layer 240 may include an interface between the first oxide cap layer 40 and the second oxide cap layer 140 depending on the degree of material flow during the bonding process.

Figure 8A:
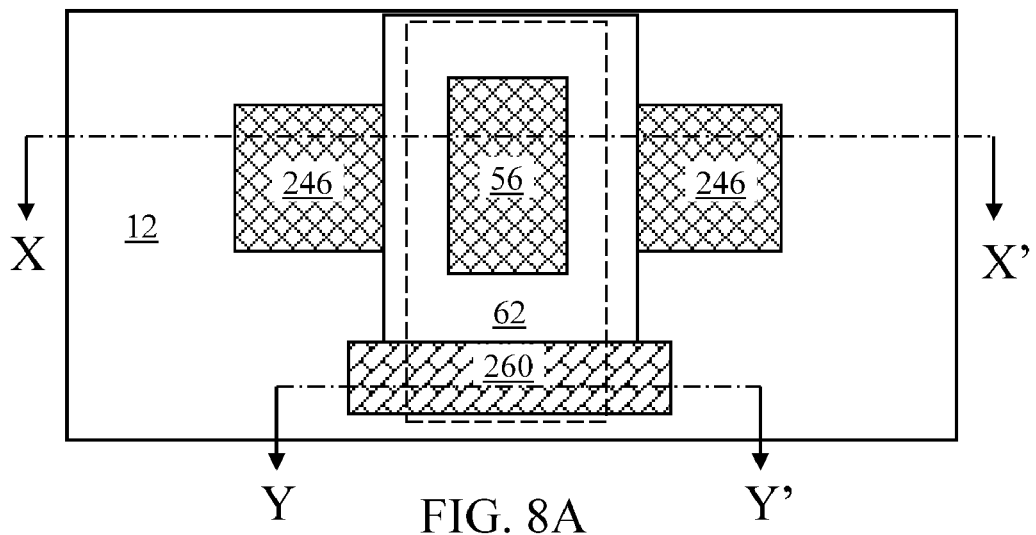
FIGS. 8A-8C are various views of a fifth exemplary semiconductor structure according to a fifth embodiment of the present invention.
Figure 8B:
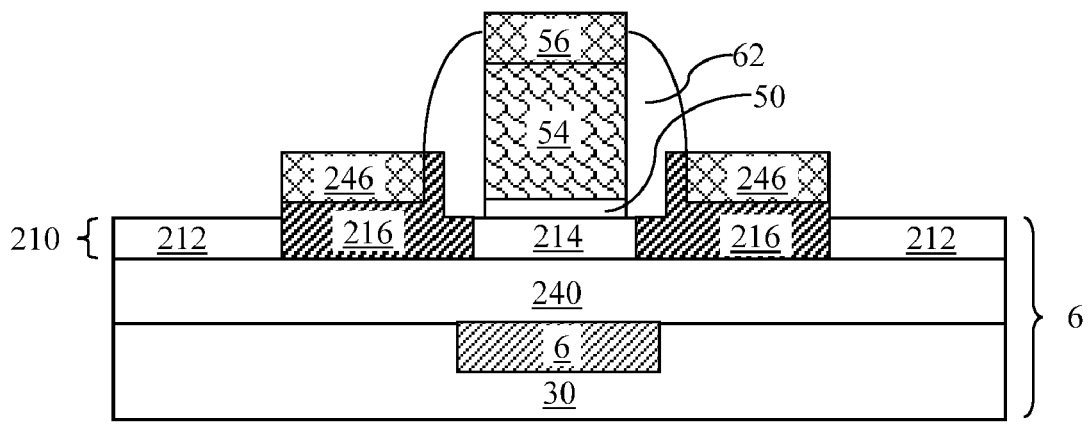
Figure 8C:
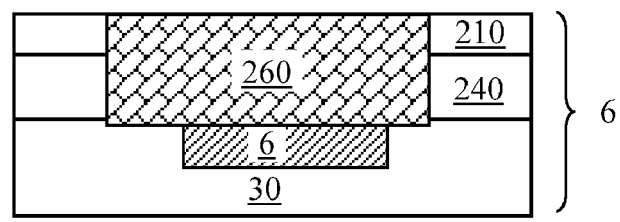

Referring to FIGS. 8A-8C, the bonded structure 6 in the first and second embodiments can be subjected to further semiconductor processing steps to form fifth exemplary semiconductor structure according to a fifth embodiment of the present invention. The fifth exemplary semiconductor structure is a dual gate field effect transistor. Conventional back-gated SOI processing steps known in the art can be employed to form the fifth exemplary semiconductor structure. While the present invention is illustrated with a single dual gate field effect transistor, multiple p-type and n-type dual gate field effect transistors with different device characteristics can be formed on the bonded substrate 6.

The steps in a conventional back-gated SOI process flow include, but are not limited to, processing steps for optional thinning of the SOI layer 210, defining an active area, formation of a back gate contact 260, removal of pad layers, optional implantation of dopants into channels, formation of a front gate structure, formation of raised source and drain regions, an activation anneal, formation of final spacers, and formation of metal semiconductor alloy portions.

The optional thinning of the SOI layer 210 can be effected by oxidation of a surface portion of the SOI layer 210 followed by a removal by an etch. The steps for defining the active area can include formation of a pad oxide layer, for example, by oxidation of the surface layer of the SOI layer 210 and deposition of a pad nitride layer. The steps for defining the active area can further include application of a photoresist and lithographic patterning of the active area by which the photoresist covers the active area, removal of exposed portions of the SOI layer 210 at least to an upper surface of the buried insulator layer 240, removal of the photoresist, optional deposition of a shallow trench isolation (STI) liner, deposition of an STI oxide, optional anneal for STI oxide densification, and planarization of the STI oxide, which can employ the pad nitride layer as a stopping layer.

The steps for forming a back gate contact 260 can include deposition of a sacrificial nitride layer, application and lithographic patterning of a photoresist to form an opening in an area corresponding to the area of the back gate contact 260 to be subsequently formed, an back gate contact etch that removes the materials of the SOI layer 210 and the buried insulator layer 240 to expose the back gate electrode 6, removal of the photoresist, deposition of a conductive material such as doped polysilicon, planarization of the conductive material employing the sacrificial nitride layer as a stopping layer, and removal of the sacrificial nitride layer. Removal of the pad layers includes removal of any remaining STI oxide on the active area and removal of the pad nitride.

Removal of the pad layers can be effected employing appropriate nitride and oxide etchants such as hot phosphoric acid and hydrofluoric acid, respectively. Optional implantation of dopants into channels, which is also known as well implantation, can be effected by application and lithographic patterning of a photoresist, ion implantation, and removal of the photoresist. Dopants are introduced into a channel region of the SOI layer to optimize device performance.

Processing steps for formation of a front gate structure can include, but are not limited to, removal of the pad oxide using an oxide etchant such as hydrofluoric acid, formation of a front gate dielectric layer by oxidation or deposition of a high dielectric constant material such as a dielectric metal oxide having a dielectric constant greater than 4.0, deposition of a conductive material layer such as a polysilicon layer, optional oxidation to form a screen oxide layer on a top surface of the polysilicon layer, optional application and lithographic patterning of a photoresist to form openings therein, optional gate ion implantation that dopes the conductive material layer as needed, removal of any remaining photoresist. The steps employed for doping the conductive material layer can be repeated as needed to provide p-type doping and n-type doping to different devices. Optionally, a nitride layer and an oxide cap layer can be deposited if selective epitaxy is to be subsequently employed to form raised source and drain regions.

A photoresist layer is applied and lithographically patterned employing global alignment markers located in the first semiconductor layer 30. The global alignment markers are not present in the SOI layer 210, but are present underneath the buried insulator layer 240 because the global alignment markers are formed within a first substrate 2 (See FIG. 2) prior to formation of the bonded substrate 6. The photoresist is patterned to cover areas in which front gate electrodes 54 are subsequently formed. An anisotropic etch removes the exposed portions of any nitride layer and oxide cap layer and the exposed portions of the screen oxide layer, the conductive material layer, and the front gate dielectric layer. A remaining portion of the front gate dielectric layer constitute a front gate dielectric 50, and a remaining portion of the conductive material layer constitutes a front gate electrode 54. Each front gate electrode 54 is aligned to a back gate electrode 6 employing the alignment marks 9 (See FIG. 2) during lithographic patterning of a conductive material layer.

Disposable spacers can be formed by depositing a conformal oxide liner and a conformal nitride layer followed by an anisotropic etch that removes at least horizontal portions of the conformal nitride layer. Raised source and drain regions 216 are formed by selective epitaxy of an intrinsic semiconductor material such as silicon, SiGe, or SiC, application and lithographic patterning of a photoresist to form openings over raised source and drain regions of selected devices, ion implantation of dopants to dope the intrinsic semiconductor material within the openings of the photoresist, and removal of the photoresist. The processing steps for doping of raised source and drain regions can be repeated to form p-doped raised source and drain regions for PFETs and n-doped raised source and drain regions for NFETs. Top surfaces of the raised source and drain regions 216 protrude above the top surface of the SOI layer 210.

Optionally, an anneal may be performed to activate the dopants implanted into the raised source and drain regions 216 and to activate and diffuse the dopants in the front gate electrode 54 down to the interface with the front gate dielectric 50. The nitride portions of the disposable spacers can be removed employing a nitride etchant such as hot phosphoric acid. Optionally, halo implantation (also known as pocket implantation) can be performed employing a patterned photoresist as an implantation mask to optimize the threshold voltages of the dual gate field effect transistors. Once the nitride portions of the dielectric spacers are removed, source and drain extension implantation can be performed employing a patterned photoresist as an implantation mask. Source and drain extension regions (not shown separately) are shown as a portion of the source and drain regions 216 in FIG. 8B.

An activation anneal is performed to activate dopants in the source and drain extension regions. Preferably, the activation anneal is a diffusionless anneal, such as, a laser anneal or a flash anneal, that avoids the loss of dopants in the source and drain extension regions into the buried oxide layer 240, which is an underlying back gate oxide layer.

Final spacers 62 are formed by optional deposition of an oxide liner layer and deposition of a conformal nitride layer, followed by an anisotropic etch that removes horizontal portions of the conformal nitride layer.

Oxide material above the front gate electrode 54 is removed employing an oxide etchant such as hydrofluoric acid. Metal semiconductor alloy portions are formed on exposed portions of semiconductor materials by depositing a metal followed by a silicidation anneal. Source and drain metal semiconductor alloy portions 246 are formed on the raised source and drain regions 216, and a gate metal semiconductor alloy portion 56 is formed on the top surface of the front gate electrode 54. If the semiconductor material of the raised source and drain regions 246 and/or the semiconductor material of the front gate electrode 54 comprise silicon, the metal semiconductor alloy portions can be metal silicide portions. Unreacted portions of the metal are removed selective to the metal semiconductor alloy portions.

The alignment of the front gate electrode 54 to the back gate electrode 6 is effected by employing the alignment marks in the first semiconductor layer 30. Since it is desirable to have the back gate electrode 6 overlap the entirety of the front gate electrode 54, one needs to take lithographic overlay error into account when designing masks. The worst-case scenario is when the back-gate mask and the front-gate mask misalign, with respect to the alignment markers, in the opposite direction. If the size of the back gate electrode 6 is made slightly wider than the size of the front gate electrode 54 by two times the lithographic overlay error, the back gate electrode 6 will completely overlap the front gate electrode 54 even in the worst-case scenario. This does introduce a physical overlap between the back gate electrode 6 and the raised source and drain regions 216 in a see-through top-down view in a direction normal to the top surface of the bonded substrate 6, i.e., in the direction normal to the exposed surfaces of the SOI layer 210. The physical overlap induces overlap capacitance between the back gate electrode 6 and the raised source and drain regions 216. However, since lithographic overlay errors for state-of-the-art lithography tools is less than 10 nm, and expected to get even lower with time, the physical overlap will be less than 20 nm, leading to a negligible increase in overlap capacitance.

Figure 9A:
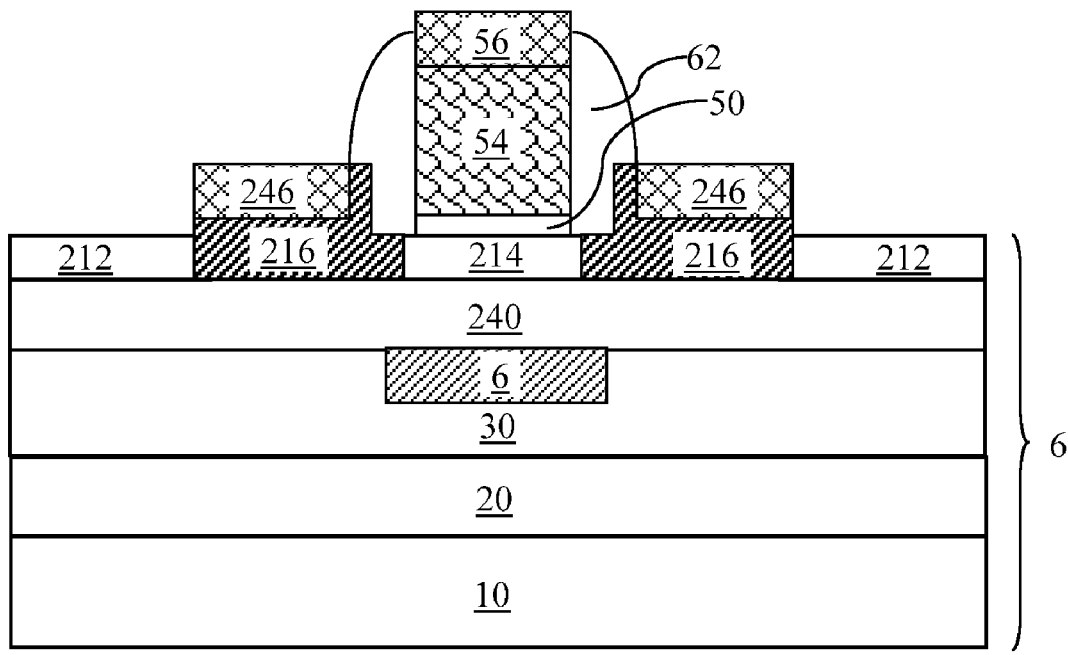
FIGS. 9A-9B are cross-sectional views of a sixth exemplary semiconductor structure according to a sixth embodiment of the present invention. A top-down view of the sixth exemplary semiconductor structure can be the same as FIG. 8A.
Figure 9B:
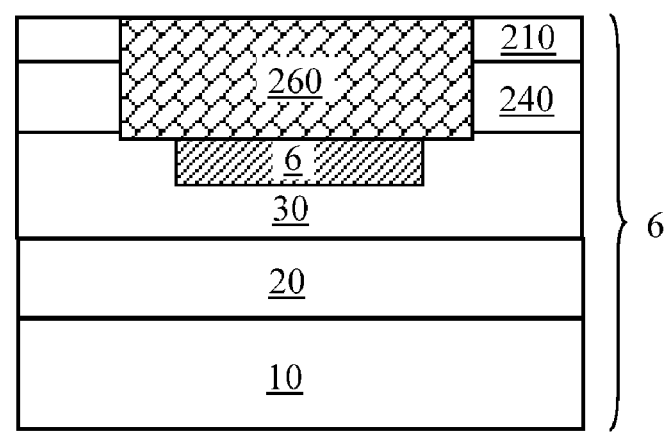

Referring to FIGS. 9A and 9B, the bonded structure 6 in the third and fourth embodiments can be subjected to further semiconductor processing steps to form sixth exemplary semiconductor structure according to a sixth embodiment of the present invention. The sixth exemplary semiconductor structure is a dual gate field effect transistor. A top-down view of the sixth exemplary semiconductor structure can be identical to the top-down view of the fifth exemplary semiconductor structure, i.e., FIG. 8A.

The difference between the sixth exemplary semiconductor structure and the fifth exemplary semiconductor structure is that the bonded substrate 6 in the sixth exemplary semiconductor structure includes a first handle substrate 10 and the first buried insulator layer 20, and that the thickness of the first semiconductor layer 30 in the sixth exemplary semiconductor structure is less than the thickness of the first semiconductor layer 30 in the fifth exemplary semiconductor structure. The same processing steps can be employed in the sixth embodiment as in the fifth embodiment to form dual gate field effect transistors.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
   forming a doped semiconductor region in an upper portion of a first semiconductor layer of a first substrate by implanting dopant ions through a portion of a first oxide cap layer on said first semiconductor layer;
   forming a layer of hydrogen atoms in a second semiconductor layer of a second substrate by implanting hydrogen ions through an entirety of a second oxide cap layer on said second semiconductor layer;
   forming a bonded substrate by bonding said first substrate and said second substrate at an interface of said first oxide cap layer and said second oxide cap layer, wherein said first and second oxide cap layers form a buried oxide layer, and a portion of said second semiconductor layer on one side of said layer of hydrogen atoms constitute a semiconductor-on-insulator (SOI) layer; and
   forming a dual gate field effect transistor on said bonded substrate, wherein said doped semiconductor region constitutes a back gate electrode and a front gate electrode overlies an entirety of said back gate electrode.

2. The method of claim 1, further comprising forming alignment marks in said first substrate prior to bonding said first substrate with said second substrate.

3. The method of claim 2, wherein said alignment marks are formed in said first semiconductor layer.

4. The method of claim 3, wherein said front gate electrode is aligned to said back gate electrode employing said alignment marks during lithographic patterning of a material layer, wherein a portion of said material layer is conductive and constitutes said front gate electrode after said lithographic patterning.

5. The method of claim 4, wherein said alignment marks are global alignment marks that are laterally separated by a distance greater than a size of an exposure field of a lithography tool.

6. The method of claim 1, wherein said first substrate is a bulk substrate comprising said first semiconductor layer and said first oxide cap layer.

7. The method of claim 1, wherein said first substrate is a semiconductor-on-insulator (SOI) substrate comprising a stack, from bottom to top, of a first handle substrate, a first buried insulator layer, said first semiconductor layer, and said first oxide cap layer.

8. The method of claim 7, wherein said doped semiconductor region contacts a surface of said first oxide cap layer and does not contact said first buried insulator layer upon formation by said implantation of said doped ions.

9. The method of claim 1, wherein said second substrate is a bulk substrate comprising said second semiconductor layer and said second oxide cap layer.

10. The method of claim 1, wherein said second substrate is a semiconductor-on-insulator (SOI) substrate comprising a stack, from bottom to top, of a handle substrate, a buried insulator layer, said second semiconductor layer, and said second oxide cap layer.

11. The method of claim 1, wherein a thickness of said buried oxide layer is the same as the sum of a thickness of said first oxide cap layer and a thickness of said second oxide cap layer.

12. The method of claim 1, wherein said second semiconductor layer is divided into a surface semiconductor portion and a bulk semiconductor portion by said layer of hydrogen atoms after said implantation of said hydrogen ions.

13. The method of claim 12, wherein said bulk semiconductor portion is cleaved off said surface semiconductor portion after said bonding of said first substrate and said second substrate, wherein said surface semiconductor portion constitutes a semiconductor-on-insulator (SOI) layer in said bonded substrate.

14. The method of claim 1, wherein said SOI layer comprises a semiconductor material selected from silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

15. The method of claim 1, wherein said SOI layer comprises a single crystalline semiconductor material.

16. The method of claim 1, wherein said back gate electrode does not underlie an entirety of source and drain regions of said dual gate field effect transistor.

17. The method of claim 1, further comprising forming a back gate contact through a portion of said SOI layer and said buried oxide layer.

18. The method of claim 1, further comprising forming raised source and drain regions on said SOI layer by selective epitaxy and ion implantation, wherein top surfaces of said raised source and drain regions protrude above a surface of said SOI layer.

19. The method of claim 1, further comprising forming metal semiconductor alloy portions on said SOI layer.

20. The method of claim 1, wherein a p-n junction is formed between said back gate electrode and said first semiconductor layer.

21. The method of claim 1, further comprising thinning said SOI layer by oxidation of a surface portion of said SOI layer and removal of an oxidized portion of said SOI layer.

* * * * *